United States Patent
Itoh et al.

(10) Patent No.: US 7,023,078 B2
(45) Date of Patent: Apr. 4, 2006

(54) PACKAGES FOR COMMUNICATION DEVICES

(75) Inventors: Hironobu Itoh, Chiba (JP); Yutaka Makishima, Chiba (JP); Hideharu Onodera, Miyagi (JP)

(73) Assignees: Seiko Instruments Inc., Chiba (JP); SII Micro Parts Ltd., Sendai (JP)

( * ) Notice: Subject to any disclaimer, the term of this patent is extended or adjusted under 35 U.S.C. 154(b) by 0 days.

(21) Appl. No.: 10/834,636

(22) Filed: Apr. 29, 2004

(65) Prior Publication Data

US 2004/0257779 A1 Dec. 23, 2004

(30) Foreign Application Priority Data

May 6, 2003 (JP) .............................. 2003-127887
Jun. 30, 2003 (JP) .............................. 2003-187805

(51) Int. Cl.
*H01L 23/02* (2006.01)

(52) U.S. Cl. ....................................... 257/678; 257/690

(58) Field of Classification Search ................ 257/678, 257/690, 738
See application file for complete search history.

(56) References Cited

U.S. PATENT DOCUMENTS 6,332,720 B1 * 12/2001 Shimaoka et al. ............ 385/88

* cited by examiner

*Primary Examiner*—Douglas W Owens
(74) *Attorney, Agent, or Firm*—Adams & Wilks

(57) ABSTRACT

A package for a communication device has a base member having a first end, a second end opposite the first end, and an interior space disposed between the first and second ends for accommodating a communication device. A conductive terminal extends through the base member from the interior space and to the exterior of the base member. A frame member is connected to the base member and has a peripheral portion protruding from the first end of the base member. A cover member is connected to the protruding peripheral portion of the frame member.

18 Claims, 5 Drawing Sheets

PACKAGES FOR COMMUNICATION DEVICES

BACKGROUND OF THE INVENTION

1. Field of the Invention

This invention relates to a package for accommodating communication devices, such as semiconductor devices, crystal oscillators, surface acoustic wave devices, magnetic devices and capacitors, and also to a process for manufacturing the same.

2. Description of the Related Art

Ceramics have usually been used for a base member for a package for communication devices, such as semiconductor devices, crystal oscillators and surface acoustic wave devices. FIG. 6 is a sectional view illustrating a known package for a communication device. It has a ceramic base member 61 having a concavity 61a open at its top for accommodating a communication device, a ceramic frame member 62b laid on the top end surface of the ceramic base member 61, a metal frame member 62a brazed to the ceramic frame member 62b and a cover member 63 welded to the metal frame member 62a. The communication device 67 is secured on a terminal 65a and is electrically connected to a terminal 65b by a wire 64. A high-melting metal, such as tungsten W or molybdenum Mo, is used as the conductive material for the terminals 65a and 65b. The ceramic frame member 62b is metallized by nickel Ni or gold Au to allow the brazing of the metal frame member 62a thereto. A metal of low thermal expansibility is used for the metal frame member 62a to make it match the ceramic base member 61 in thermal expansibility. Kovar, a metallic material of low thermal expansibility, is usually used for the cover member 63 welded to the metal frame member 62a, since the use of a metallic material of high thermal expansibility causes inconveniences, such as the cracking of the ceramic base member 61. The package for a communication device as described requires layered sintering at a temperature close to 2000° C. between the ceramic base and frame members 61 and 62b and brazing at a temperature close to 1000° C. between the metal and ceramic frame members 62a and 62b. The joining of the members at such high temperatures and the welding of the cover member 63 to the metal frame member 62a have made it possible to achieve a gastight seal.

Reference is made to Japanese Patent Office Official Gazette JP-A-11-67950 for the related art.

The known structure and manufacturing process, however, require high costs of processing and equipment, since the terminals for supplying electricity to the communication device situated on the base member require a process including ceramics molding, repeated printing of the conductive metal and firing. Expensive jigs are also required for the highly accurate printing of the conductive metal (a high-melting metal, such as W or Mo) to form the terminals on a green sheet of ceramics. The brazing of the metal frame member to the ceramics makes it desirable for the metal to have only a small difference in thermal expansibility from the ceramics. While Kovar is usually used for the cover member, it is undesirably impossible to make a small package containing any magnetic device, since Kovar is magnetic and has to be satisfactorily spaced apart from the device. The brazing of the metal frame member to the ceramic frame member requires their gold plating which involves a high cost of material. While a package for a capacitor requires the terminals and the metal frame and cover members to be of a metallic material not reacting with the electrolyte, the selection of any metallic material other than tungsten, molybdenum and Kovar for the known structure of a package for any communication device has resulted in an undesirably large difference in thermal expansibility from the ceramics and its failure to be satisfactorily gastight.

Accordingly, every package for any communication device having a ceramic base member has involved high costs of processing, equipment, jigs and materials. It has been difficult to make a small package for any magnetic device. It has been impossible to ensure a satisfactorily high level of gas tightness for any package for a capacitor.

SUMMARY OF THE INVENTION

It is, therefore, an object of this invention to provide an inexpensive and highly gastight package for a communication device.

It is another object of this invention to provide a process for manufacturing such a package.

According to a first aspect of this invention, there is provided a package for a communication device, comprising a base member formed from a resinous material, having a concavity and shaped like a box, a conductive terminal extending through the base member from the inside of the concavity of the base member to its outside, a frame member formed from a metallic material and joined to the base member and a cover member formed from a metallic material and superposed on the frame member.

The use of a resinous material for the base member makes it easy to mold the base member and makes it possible to unite the conductive terminal for a metallic material and the frame member together in a mold. It is preferable to employ the so-called insert molding as a simple method including injecting a resinous material into a mold after positioning therein the conductive terminal and frame member as pressed, cut or otherwise machined. A metallic material, such as stainless steel, an iron alloy, copper, a copper alloy or aluminum, is used for the conductive terminal. A metallic material, such as stainless steel, an iron alloy, copper, a copper alloy or aluminum, is also used for the frame and cover members. The conductive terminal can be made at a low cost by press molding, while the conductive terminal for the known package for a communication device has been formed by printing a green sheet of ceramics with a metal paste prepared by mixing a tungsten powder with an organic solvent, and sintering it at a high temperature close to 2000° C.

The package for a communication device according to this invention is also characterized by the frame member protruding along its whole periphery from the top of the concavity at which the base member is open, at least a part of the frame member protruding from the bottom of the base member.

Although it is possible to have the frame member protrude along its whole periphery from the bottom of the base member, too, it is preferable to cut away a part of the frame member and have another part thereof protrude from the bottom of the base member to avoid any interference of the frame member with the conductive terminal extending out of the base member.

The base member of a resinous material has its rigidity improved by the frame member and its sidewall thickness reduced to allow the construction of a small package for a communication device. When the cover member is joined to the frame member, the frame member protruding from the bottom of the base member can be held to enable a satisfactorily high load to bear upon the cover and frame members, thereby making it possible to prevent any deformation of the base member of a resinous material.

The package for a communication device according to this invention is also characterized by the base member formed from any of the materials of the epoxy, polyimide, polyphenylene sulfide, polyester, polyamide and polyether series. The use of these resins gives the base member rigidity and heat resistance allowing a wiring connection from the communication device to the conductive terminal by wire bonding, soldering, resistance welding, application of a conductive adhesive under heat, etc., and ensures therefor a satisfactorily high heat resistance under the heat applied for joining the package to a package board.

The package according to this invention is also characterized by the cover member being welded to the frame member.

The frame member formed from a metallic material and joined to the base member enables the cover member to be welded to the frame member in a highly gastight fashion.

According to a second aspect of this invention, there is provided a process for manufacturing a package for a communication device, comprising the steps of positioning a conductive terminal and a frame member, both of a metallic material, in a mold for forming a base member, injecting a resinous material into the mold to form the base member having a concavity and shaped like a box, while uniting the conductive terminal and the frame member together, positioning a communication device on the base member and superposing a cover member on the frame member and welding the cover and frame members together under heat.

The base member and the conductive terminal, and the base and frame members are joined together by injecting a resinous material into the mold after positioning therein the conductive terminal and frame member as pressed, cut or otherwise machined, and a satisfactory seal is made upon curing of the base member. A metallic material, such as stainless steel, an iron alloy, copper, a copper alloy or aluminum, is used for the conductive terminal. A metallic material, such as stainless steel, an iron alloy, copper, a copper alloy or aluminum, is also used for the frame and cover members. The heat employed for welding includes the heat of light produced by the fundamental wavelength, or second or third harmonic of a YAG laser, or a semiconductor laser, frictional heat produced on the frame and cover members by ultrasonic vibration generated by a piezoelectric oscillator, heat of resistance heating produced by supplying electricity to those members and heat produced by supplying electricity to the cover member alone.

The so-called insert molding with the conductive terminal and the frame member positioned in the mold for forming the base member makes it possible to unite the frame member, conductive terminal and base member together easily, while ensuring the satisfactorily high gas tightness of the package.

It is possible to manufacture a package inexpensively at a low temperature, as opposed to the known package for a communication device for which sintering at a high temperature close to 2000° C. has been necessary for the conductive terminal after printing it on a green sheet of ceramics with a metal paste prepared by mixing a tungsten powder with an organic solvent, and heating at a high temperature close to 1000° C. has been necessary for brazing the frame member to the ceramic base member. The welding of the cover member to the frame member by using a heating device after securing the communication device in position in the base member makes it possible to realize a highly gastight package for the communication device. As the base member can be molded at a low temperature, the materials for the conductive terminal and the frame member are not limited to ones of low thermal expansibility. It is, therefore, possible to manufacture a package for a communication device at low costs of processing, equipment, jigs and materials.

The process according to this invention is also characterized by at least either the conductive terminal or the frame member being formed as a plurality of continuous ones in a metal foil, the frame of the metal foil and a part of the conductive terminals or frame members having therebetween bridges which are cut off the frame of the metal foil after the step of superposing the cover member on the frame member and welding the cover and frame members together under heat.

The conductive terminal or the frame member is formed as a plurality of continuous ones in a metal foil, or by the so-called hoop molding.

The use of a hoop up to the steps of securing the communication device in position in the base member as molded and welding the cover member to the frame member makes it possible to use guide holes made in the frame of the hoop and thereby facilitates the positioning of a small package for a communication device.

DETAILED DESCRIPTION OF THE PREFERRED EMBODIMENTS

Figure 1:
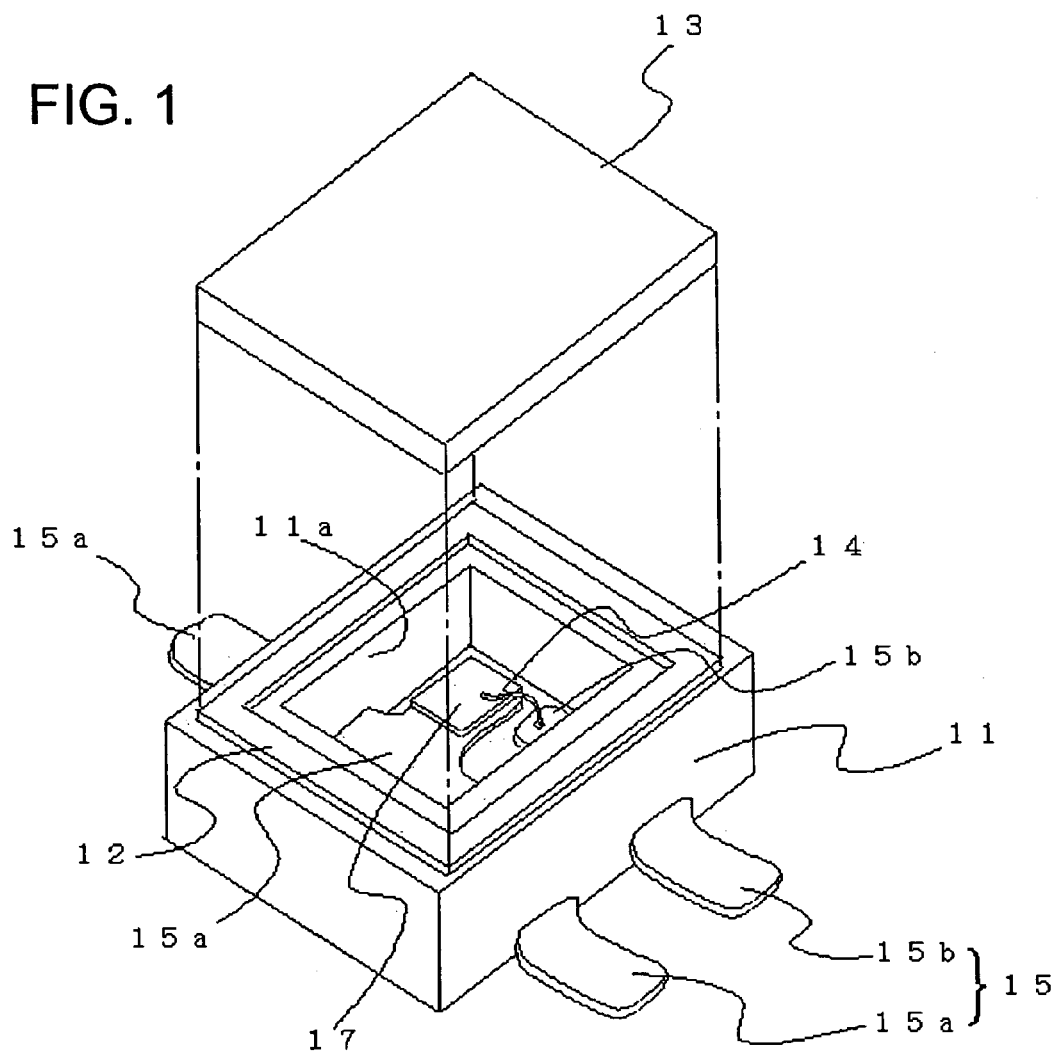
FIG. 1 is a view showing the structural features of a package for a communication device according to a first embodiment of this invention.
Figure 2:
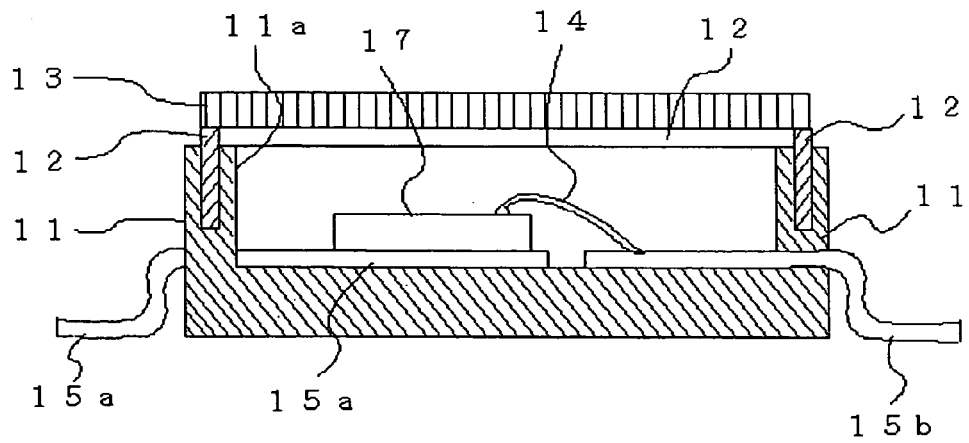
FIG. 2 is a front elevational view, partly in section, of the package shown in FIG. 1.

The invention will now be described in further detail with reference to the drawings. Referring first to FIGS. 1 and 2, there is shown a package for a communication device according to a first embodiment of this invention.

It has a base member 11 formed from a resinous material and accommodating a communication device 17, a frame member 12 formed from a metallic material and joined to the base member 11 and a cover member 13 formed from a metallic material and superposed on and welded to the frame member 12. The base member 11 has a concavity 11a open at its top and defining an interior space accommodating the communication device 17, and the frame member 12 protrudes along its whole periphery from the top of the concavity 11a and is joined to the base member 11. A conductivity terminal 15 for making electrical connection between the communication device 17 situated in the base member 11 and the exterior of the base member 11 constitutes a conductive terminal 15a exposed on the bottom of the concavity 11a for holding the communication device 17 in position and a conductive terminal 15b making electrical connection with the communication device 17 via a wire 14 and extends outwardly from the concavity 11a of the base member 11 through its sidewall. The conductive terminals 15a and 15b are joined to the sidewall of the base member 11 in a fluid-tight manner so that there is no infiltration of air of moisture through their joints. While any electrically insulating resin can be used as a material for the base member 11, a heat-resistant thermostating resin of the epoxy or polyimide series, or a thermoplastic resin of the polyphenylene sulfide, polyester, polyamide or polyether series is suitable from the standpoints of rigidity and heat resistance. The polystyrene series includes syndiotactic polystyrene, the polyphenylene sulfide series linear and crosshinked polyphenylene sulfides, the polyester series wholly aromatic polyesters called liquid crystal polymers, the polyamide series nylons, and the polyether series polyether ether ketone, polyether sulfone and polyether imide. A metallic material, such as stainless steel, an iron alloy, copper, a copper alloy or aluminum, is used as the material for the conductive terminal 15. Nickel, gold, copper, tin, etc. may be applied for its surface treatment. A metallic material, such as a stainless steel, an iron alloy, copper, a copper alloy or aluminum, is also used as the material for the frame and cover members 12 and 13.

In the foregoing first embodiment, an epoxy resin was used for the base member 11, copper for the conductive terminal 15 and stainless steel for the frame and cover members 12 and 13.

The so-called hoop forming is applied to the conductive terminal 15 and the frame member 12 to form them continuously from a metal foil and they are secured to the base member 11 in a unitary fashion by the so-called insert molding in which they are positioned in the mold for forming the base member 11 and the resin is injected into the mold. More specifically, the conductive terminal 15 was formed by a press in a copper foil having guide perforations for feeding to prepare a hoop and the frame member 12 was formed by a press in a stainless steel foil having guide perforations for feeding to prepare another hoop. The conductive terminal 15 was positioned in the mold for the base member 11 together with a frame having guide perforations for feeding, while the frame member 12 was positioned in the mold for the base member 11 after it had been cut off a frame having guide perforations for feeding immediately before its positioning in the mold for insert molding, and the epoxy resin was injected for insert molding to make a plurality of base members 11 continuously. Then, the conductive terminal 15 was cut off the frame having guide perforations for feeding. A communication device 17 was placed in each base member 11 formed as described. After the communication device 17 was fixed in position on the conductive terminal 15a with a conductive adhesive, the conductive terminal 15b and the communication device 17 were connected to each other by a wire 14 with a wire bond. Then, after the characteristics of the communication device 17 were examined, the frame member 12 and the cover member 13 as press formed and cut off a stainless steel foil were superposed on each other and seam welded by using a YAG laser of a fundamental wavelength, whereby the package for the communication device was made.

When a leak test was conducted to evaluate the package for its gas tightness by immersing it in a liquid containing fluorine, it indicated a gas tightness of 10–5 atm. cc/sec. or higher. The communication device 17 did not show any change in characteristics from before the welding of the cover member 13 to thereafter.

When a magnetic device was packaged as the communication device 17, no trouble occurred to its driving, since none of the epoxy resin used for the base member 11, copper for the conductive terminal 15 and stainless steel for the frame and cover members 12 and 13 had magnetic property.

When a capacitor was packaged as the communication device 17, a satisfactorily tight seal could be obtained, when an epoxy resin was used for the base member 11 and stainless steel for the conductive terminal 15 and the frame and cover members 12 and 13, since none of them reacted with the electrolyte.

Figure 3:
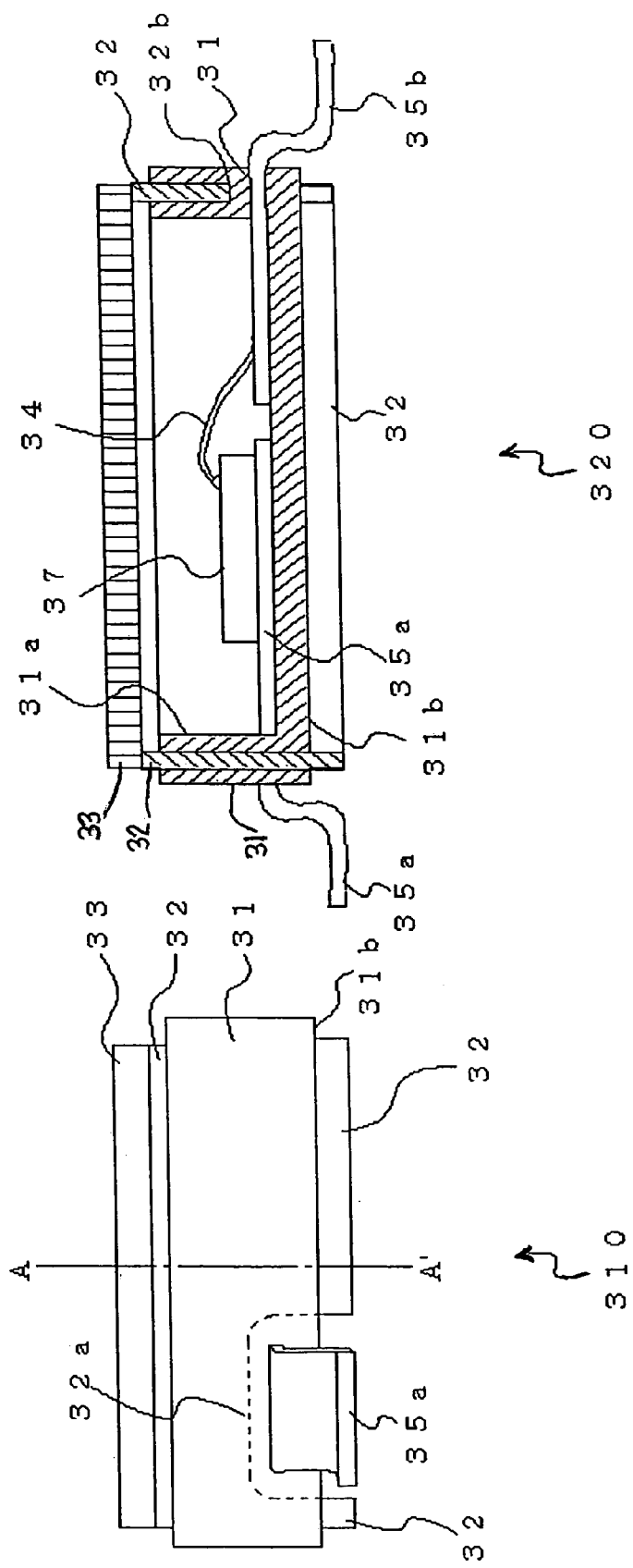
FIG. 3A is a side elevational view of a package for a communication device according to a second embodiment of this invention.
FIG. 3B is a front elevational view, partly in section, of the package shown in FIG. 3A.

A package for a communication device according to a second embodiment of this invention is shown in FIGS. 3A and 3B. FIG. 3A is a side elevational view thereof and FIG. 3B includes a sectional view taken along the line A–A' of FIG. 3A. A frame member 32 protrudes along its whole periphery from the top of a concavity 31a where a base member 31 is open, and at least a part of the frame member 32 protrudes also from the bottom 31b of the base member 31. A conductive terminal 35a on which a communication device 37 is secured in position, and a conductive terminal 35b connected to the communication device 37 by a wire 34 extend outwardly from the base member 31, and the frame member 32 has windows 32a and 32b avoiding its interference with the conductive terminals 35a and 35b. The window 32a situated inwardly of the base member 31 is shown by a broken line in FIG. 3A. FIG. 3B shows that the window 32b keeps the frame member 32 away from contact with the conductive terminal 35b, and that electrical insulation therebetween is ensured by the resinous material of the base member 31.

According to the foregoing second embodiment, an epoxy resin was used for the base member 31, copper for the conductive terminals 35a and 35b, and stainless steel for the frame member 32 and the cover member 33. The frame member 32 and the conductive terminals 35a and 35b were made by press forming, and positioned in a mold for forming the base member 31, and the base member 31 was made by insert molding, as was the case with the first embodiment.

A communication device 37 was placed in each base member 31 formed as described. After the communication device 37 was fixed in position on the conductive terminal 35a with a conductive adhesive, the conductive terminal 35b and the communication device 37 were connected to each other by the wire 34 with a wire bond. Then, after the characteristics of the communication device 37 were examined, the frame member 32 and the cover member 33 as press formed and cut off a stainless steel foil were superposed on each other and seam welded by using a YAG laser of a fundamental wavelength, whereby the package for the communication device was made.

According to another welding method, the frame and cover members 32 and 33 were held between welding electrodes and joined together by resistance heating. Although a load had to be applied until there was no clearance between the frame and cover members 32 and 33, they could be welded together without causing the base member 31 to be deformed.

When a leak test was conducted to estimate the gas tightness of each of the packages as welded by those methods by immersing it in a liquid containing fluorine, it indicated a gas tightness of 10–5 atm. cc/sec. or higher. The communication device 37 did not show any change in characteristics from before the welding of the cover member 33 to thereafter.

Figure 4:
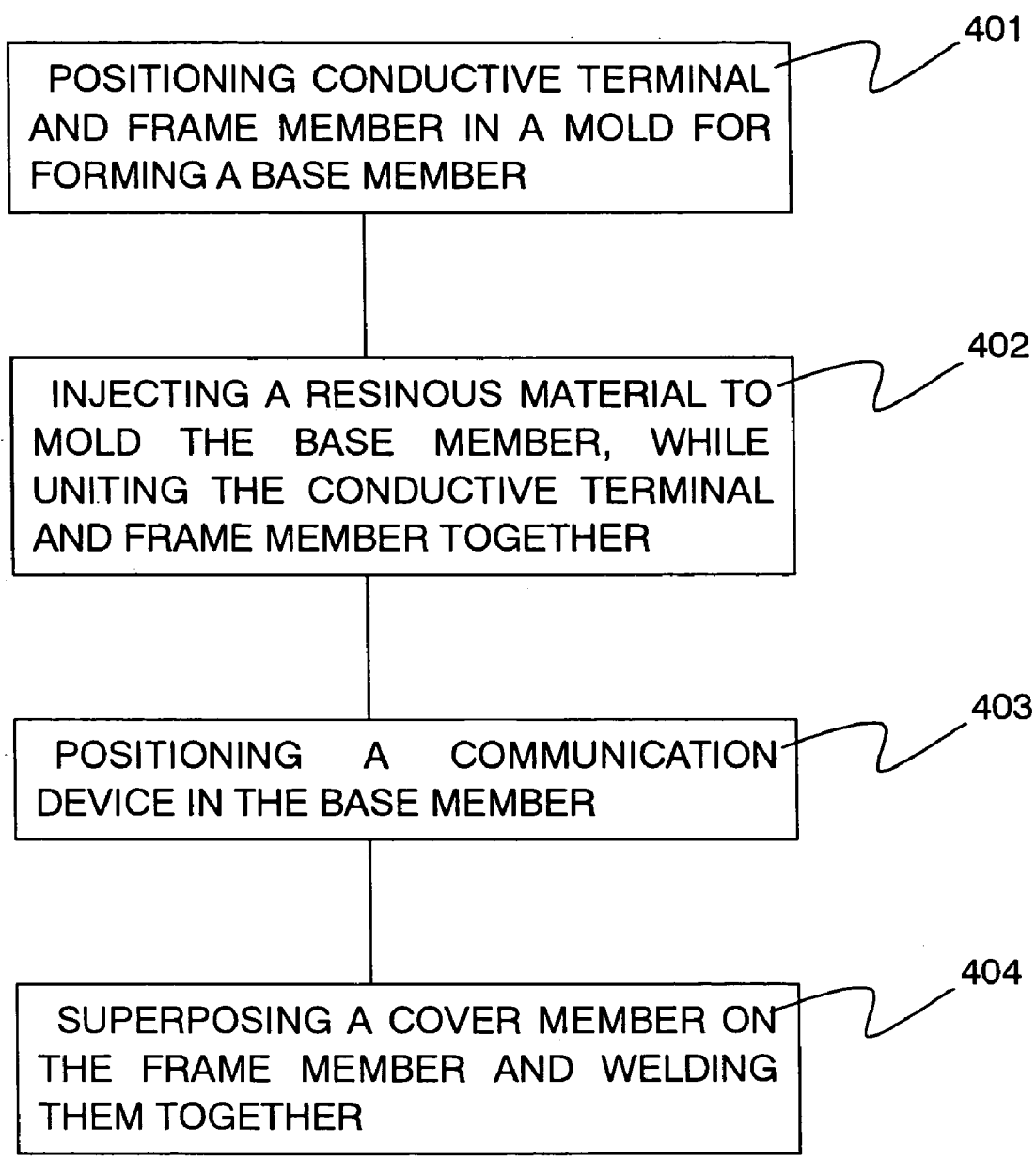
FIG. 4 is a flowchart showing a process embodying this invention for manufacturing a package for a communication device.

FIG. 4 is a flowchart illustrating a process for manufacturing a package for a communication device according to this invention. A conductive terminal 15 press formed from a copper foil and a frame member 12 press formed from a stainless steel foil are positioned in a mold for molding a base member 11 (Step 401). Then, an epoxy resin is injected into the mold for the base member 11 and is cooled to cure (Step 402). Then, a communication device 17 is secured to the conductive terminal 15a with a conductive adhesive and a wire 14 is connected by a wire bonder to make electrical connection between the conductive terminal 15b and the communication device 17 (Step 403). Then, a cover member 13 is superposed on the frame member 12 and they are welded together along their whole periphery by a YAG laser of a fundamental wavelength (Step 404).

A method which can be employed for welding the frame and cover members 12 and 13 beside using a YAG laser having a fundamental wavelength is a method employing heat of radiation produced by a second or third harmonic YAG laser, or a semiconductor laser, a method employing frictional heat produced by pressing an ultrasonic oscillator against the cover member 13 to rub it against the frame member 12, or a method employing heat of resistance heating performed by supplying electricity to the cover member 13 or the frame and cover members 12 and 13.

When a leak test was conducted to estimate the sealing of the package manufactured as described by immersing it in a liquid containing fluorine, it indicated a gas tightness of 10–5 atm. cc/sec. or higher. The communication device 17 did not show any change in characteristics from before the welding of the cover member 13 to thereafter. When polyphenylene sulfide was used to make a base member by insert molding with a conductive terminal and a frame member, satisfactory sealing could be ascertained between the conductive terminal and the frame and base members and between the frame and cover members welded by a YAG laser having a fundamental wavelength.

Figure 5:
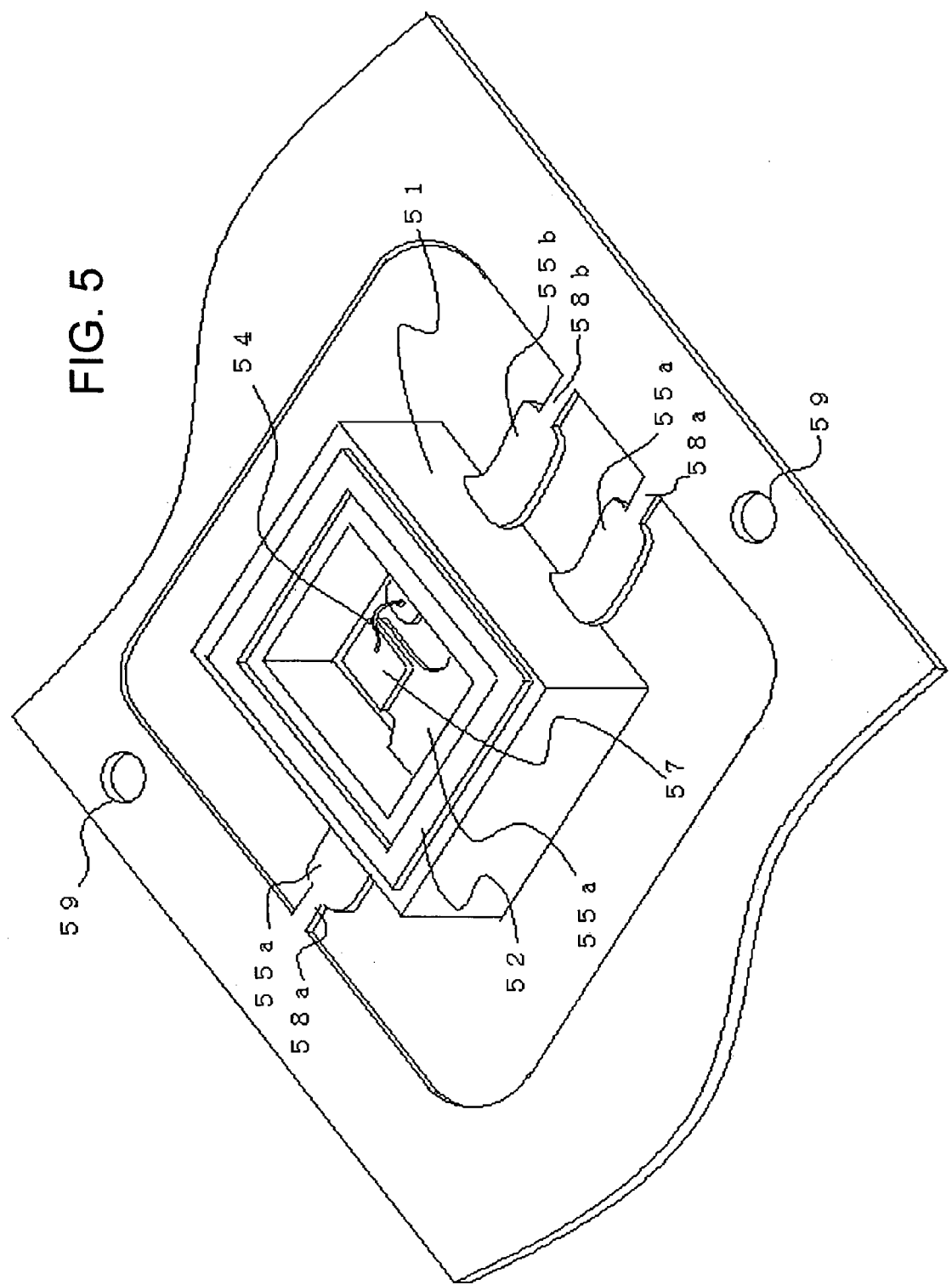
FIG. 5 is a perspective view illustrating the process according to this invention.
Figure 6:
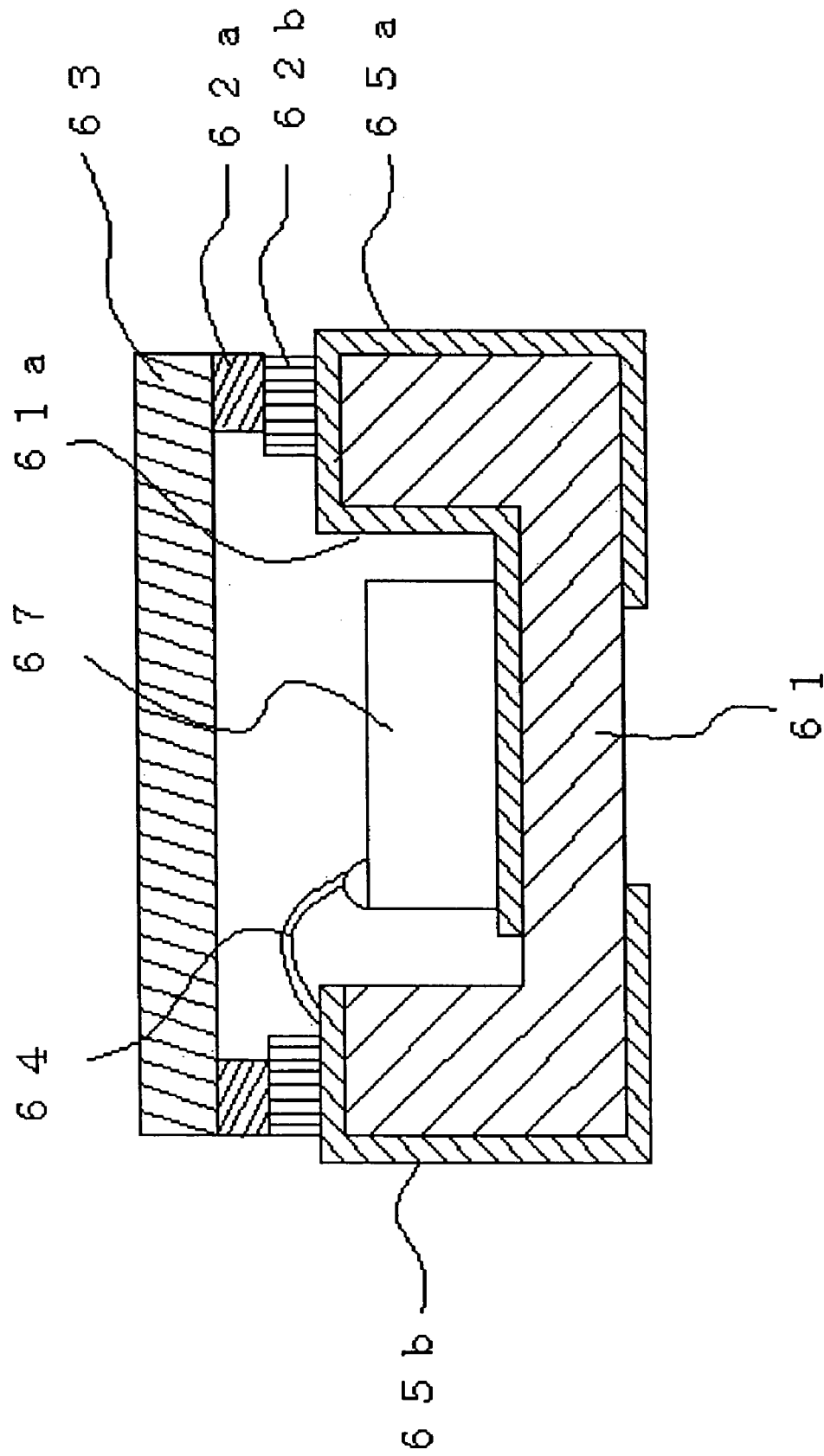
FIG. 6 is a front elevational view, partly in section, of a known package for a communication device.

Reference is now made to FIG. 5 outlining another process for manufacturing a package for a communication device according to this invention.

Conductive terminals 55a and 55b are connected to a hoop by bridges 58a and 58b, respectively. The conductive terminals 55a and 55b connected by the hoop and a frame member 52 were positioned in a mold for molding a base member and the base member 51 was molded. A communication device 57 was secured in position on the conductive terminal 55a and a wire 54 was connected between the conductive terminal 55b and the communication device 57 by a wire bonder. Then a cover member not shown was superposed on the frame member 52 and welded thereto. After these steps, the bridges 58a and 58b were cut off. The positioning of the communication device, the superposition of the cover member on the frame member 52 and the welding of the cover member were all carried out with the aid of guide pins inserted in guide holes 59 made in the frame of the hoop. As a result, no positioning guide hole has to be made in the base member 51, but it is possible to achieve a high accuracy in securing the communication device in position on the conductive terminal 55a and laying the wire 54 between the conductive terminal 55b and the communication device 57, even if the base member 51 may have a contour varying in shape, since the conductive terminals 55a and 55b and the guide holes made in the frame of the hoop are positioned accurately. It has been confirmed that this process is effective for making a small communication device, or package therefor.

The package for a communication device according to this invention includes a base member formed from a resinous material and shaped like a box, a conductive terminal formed from a metallic material, extending from the inside of the base member to its outside and secured thereto, a frame member formed from a metallic material and secured to the base member and a cover member welded to the frame member, as described. High productivity can be achieved, as the conductive terminal and the frame member are united together with the molding of the base member. It has also been possible to prevent any invasion of air and moisture into the interior by welding the cover member to the frame member and obtain a highly gastight and reliable package for a communication device and a process for manufacturing the same.

What is claimed is:

1. A package for a communication device, the package comprising:
    a base member formed from a resinous material, the base member having a concavity having an open end and defining an interior space of the base member;
    a conductive terminal extending through the base member from the interior space and to the exterior of the base member;
    a frame member formed from a metallic material and connected to the base member, the frame member having a peripheral portion protruding from a first end of the base member at the open end of the concavity thereof; and
    a cover member formed from a metallic material and superposed on the frame member.

2. A package according to claim 1; wherein the base member is formed from a material selected from the group consisting of epoxy, polyimide, polyphenylene sulfide, polyester, polyamide and polyether series.

3. A package according to claim 1; wherein the cover member and the frame member are welded together.

4. A package according to claim 1; wherein the cover member is connected directly to the protruding peripheral portion of the frame member.

5. A package according to claim 4; wherein the cover member is welded to the protruding peripheral portion of the frame member.

6. A package according to claim 1; wherein the base member is generally box-shaped.

7. A package for a communication device, the package comprising:
    a generally box-shaped base member formed from a resinous material, the base member having an upper end, a lower end, and a concavity defining an interior space of the base member and opening to the upper end;
    a conductive terminal extending through the base member from the interior space and to the exterior of the base member;
    a frame member formed from a metallic material and connected to the base member, the frame member having an upper peripheral portion protruding from the upper end of the base member and a second peripheral portion protruding from the lower end of the base member; and
    a cover member formed from a metallic material and superposed on the frame member.

8. A package according to claim 7; wherein the base member is formed from a material selected from the group consisting of epoxy, polyimide, polyphenylene sulfide, polyester, polyamide and polyether series.

9. A package according to claim 7; wherein the cover member and the frame member are welded together.

10. A package according to claim 7; wherein the cover member is connected directly to the protruding upper peripheral portion of the frame member.

11. A package according to claim 10; wherein the cover member is welded to the protruding upper peripheral portion of the frame member.

12. A package for a communication device, the package comprising:
 a base member having a first end, a second end opposite the first end, and an interior space disposed between the first and second ends for accommodating a communication device;
 a conductive terminal extending through the base member from the interior space and to the exterior of the base member;
 a frame member connected to the base member and having a peripheral portion protruding from the first end of the base member; and
 a cover member connected to the protruding peripheral portion of the frame member.

13. A package according to claim 12; wherein the base member is formed from a resinous material and the frame member and cover members are formed from a metallic material.

14. A package according to claim 12; wherein the base member is formed from a material selected from the group consisting of epoxy, polyimide, polyphenylene sulfide, polyester, polyamide and polyether series.

15. A package according to claim 12; wherein the cover member and the frame member are welded together.

16. A package according to claim 12; wherein the cover member is connected directly to the protruding peripheral portion of the frame member.

17. A package according to claim 16; wherein the cover member is welded to the protruding peripheral portion of the frame member.

18. A package according to claim 12; wherein the peripheral portion of the frame member comprises a first peripheral portion; and wherein the frame member has a second peripheral portion protruding from the second end of the base member.

* * * * *